LOGIC CIRCUIT

Filed Aug. 27, 1962

INVENTORS
JACK SAUL CUBERT
FRANCINE JOY WEINTRAUB

BY J. Donald Weber, Jr.
AGENT

3,201,614
LOGIC CIRCUIT

Jack Saul Cubert, Willow Grove, Pa., and Francine Joy Weintraub, Somerdale, N.J., assignors to Sperry Rand Corporation, New York, N.Y., a corporation of Delaware Filed Aug. 27, 1962, Ser. No. 219,555
8 Claims. (Cl. 307—88.5)

Figure 1:
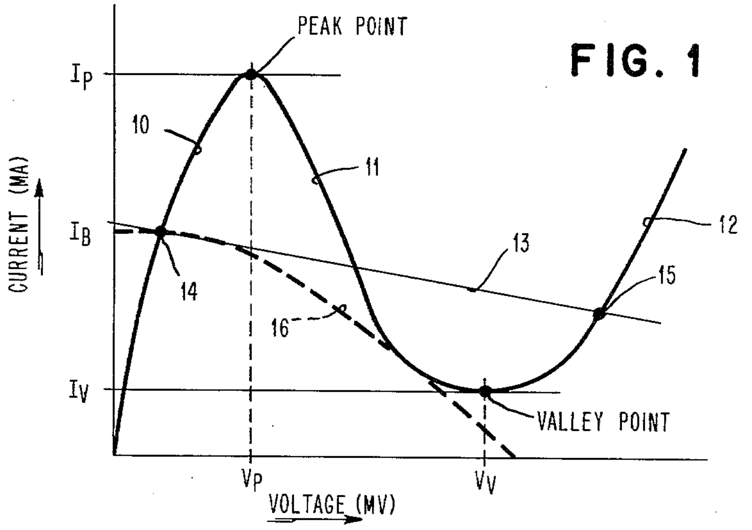

This invention relates to a logic circuit utilizing a plurality of semiconductor devices. In particular, the semiconductor devices are transistors and tunnel diodes. The tunnel diodes are used as input coupling devices and are connected to one electrode of a transistor which provides output signals in accordance with the input signals supplied to the tunnel diodes.

In the construction of many types of business machines, for example digital computers, logic circuits form important basic building blocks thereof. These logic circuits are utilized to perform many logic functions, as for example, AND, OR, etc. Various circuits and circuit techniques have been utilized to perform these logic functions. In the past, transistor circuits have been used for logic operations. However these circuits have been limited by the speed of operation and by the input signals supplied thereto. Similarly, tunnel diode circuits have been utilized as logic circuits but some of these circuits suffer from lack of amplification capabilities. Thus, in many situations it is desirable to combine transistors which have amplification characteristics with tunnel diode devices which have high speed operation as well as bistable operating characteristics and are less critically affected by the type of input signal applied thereto. By properly combining the tunnel diode and transistor devices, the advantageous characteristics of each may be utilized.

Thus, as in the instant invention, a plurality of tunnel diodes are connected as a gate. This gate is then connected to one electrode of a transistor. The transistor provides an output signal in accordance with the input signals supplied by the gate. Clearly, the amplification inherent in the transistor is utilized to amplify signals produced by the fast acting tunnel diode.

Furthermore, it often happens that in larger systems, for example comprising a plurality of logic circuits, the pulse shape or wave shape at the initial circuit and the pulse shape or wave shape at the final circuit in the system may be quite dissimilar inasmuch as the operation of the intermediate circuits often causes a deterioration, or the like, of the signal. However, since a tunnel diode, in effect, produces a fast level change when it switches from one operating condition to another, a pulse shaping network is inherently included in the input of the amplifying transistor circuit. Thus, a high speed amplifying circuit is provided with good pulse resolution.

Consequently, one object of this invention is to provide a high speed logic circuit.

Another object of this invention is to provide a high speed logic circuit utilizing tunnel diodes and transistors.

Another object of this invention is to provide a high speed logic circuit using regenerative gain and providing reshaping of input signals.

Another object of this invention is to provide a high speed logic circuit capable of operating with pulse type or level type signals.

Figure 2:
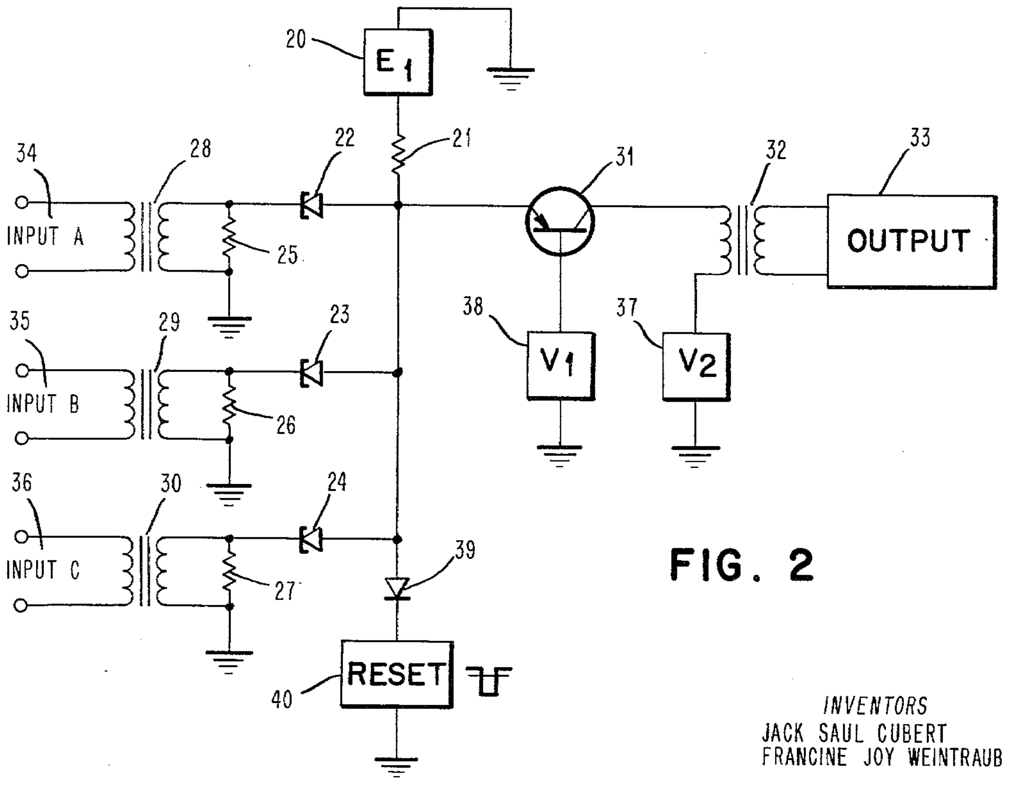

These and other objects and advantages of the circuit will become more readily apparent with the reading of the following description in conjunction with the drawings, in which:

FIGURE 1 is a graphic showing of a tunnel diode voltage-current operating characteristic; and FIGURE 2 is a schematic drawing of a preferred embodiment of the circuit which is the subject of this invention.

Referring now to FIGURE 1, the graphic diagram of a typical tunnel diode characteristic is shown. Since tunnel diodes and their characteristics are known in the art, a detailed description of the operation of the tunnel diode is not necessary. Various references which relate to semi-conductors are available and provide a detailed, mathematical analysis of the tunnel diode operation and the characteristics derived therefrom. Briefly, the high-current, low-voltage or peak operating region is indicated by reference numeral 10. The line portion 12 represents the high-voltage or forward operating region. Line portion 11 (which is shown in order to effect a more graphical representation) represents the so-called negative resistance operating region. The peak point and the valley point represent the points in the curve where the derivative thereof would be zero and are used to designate various operating regions of the tunnel diode. The load line 13 is a typical load line for a conventional type linear load, as for example, a resistance or a linear type of impedance. This load line intersects the V–I characteristic of the tunnel diode in the two stable operating regions. The two intersections 14, 15 represent two stable operating conditions of the tunnel diode. A further load line 16 is shown intersecting the tunnel diode characteristic in only one of the stable operating conditions. This load line represents a non-linear load, as for example a diode. For convenience, the intersection is coincidental with previously mentioned intersection 14. Load line 16 has a substantially curved characteristic and does not intersect the second stable operating region of the tunnel diode. The precise configuration of load line 16 is not critical to the operation of the circuit of FIGURE 2 so long as the higher voltage portion thereof falls below the valley point of the tunnel diode characteristic. The instant circuit may be characterized by a plurality of load lines similar to load line 16 which form a family of curves all similar to load line 16 and a linear load line similar to load line 13. Thus, in accordance with the load line configuration utilized, the tunnel diode is capable of operating in either a bistable or a monostable mode. The load line configuration to be used is dependent upon the input signals as will appear subsequently.

Referring now to FIGURE 2, there is shown a schematic diagram of the circuit which forms the subject of the invention. A potential source 20 which may be of any conventional type of D.C. source capable of supplying about +25 volts, is connected to resistor 21 which may be about 1000 ohms. The combination of source 20 and resistance 21 may, inf act, represent any conventional constant current source for supplying about 25 milliamperes. This current magnitude is not meant to be limitative but rather is illustrative only. Resistor 21 is further connected to the anodes of input tunnel diodes 22, 23 and 24. These tunnel diodes may be RCA IN3129 which are 20 milliamperes (peak current) tunnel diodes. The cathodes of the tunnel diodes are individually connected to one terminal of the secondary windings of transformers 28, 29 and 30, respectively. Across the secondary windings are connected low impedances 25, 26 and 27, respectively. These low impedances may be resistors on the order of 100 ohms. Transformers 28, 29 and 30 which may be 4:1 or 8:1 transformers have the primary windings thereof respectively connected to separate input circuits 34, 35 and 36. For convenience, these input circuits are labeled input A, input B and input C. The input circuits may, in fact, comprise other circuits similar to the instant circuit as will be seen subsequently. The input circuits may be capable of providing pulse or level type signals.

The anodes of the tunnel diodes 22, 23 and 24 are also connected to one electrode of transistor 31. In a preferred embodiment, the tunnel diodes are connected to the emitter electrode of a PNP type transistor, for example a 2N695. The base electrode of the transistor is connected to the potential source 38. This potential source may be ground potential or slightly negative with respect to ground to properly bias the transistor to the most advantageous operating point. That is, at this operating point the tarnsistor is biased slightly ON but still presents a high input impedance so that the transistor is fully turned ON only when all tunnel diodes are switched as discussed subsequently. The collector eletrode of the transistor 31 is connected to one terminal of the primary winding of output transformer 32. Output transformer 32, like input transformers 28, 29 and 30 may have a 4:1 or 8:1 turns ratio and arranged such that the output waveform on the secondary winding is inverted with respect to the input waveform on the primary winding. Another terminal of the primary winding of transformer 32 is connected to the voltage source 37. This voltage source may be any conventional D.C. source capable of providing about −10 volts and is used to bias the collector electrode of the transistor 31 such that the most favorable operation is obtained. That is, in a preferred embodiment, the transistor 31 is biased to be slightly conducting but definitely unsaturated. This bias conduction provides voltage amplification and high speed operation. The secondary winding of transformer 32 is connected to the output device 33. It is to be understood, of course, that output device 33 may, in fact, comprise another circuit similar to that shown although such a limitation is not required.

Typically, this circuit may operate as an AND circuit. That is, an output signal is produced in response to the application of a predtermined number of input signals—in this case, three input signals. In the operation of the preferred embodiment shown, a bias current is supplied by the constant current source comprising source 20 and resistor 21. This current is so designed that when all three of the tunnel diodes are biased to the low voltage state, each of the three diodes conducts substantially one-third of the current flow through resistor 21. Thus, if the current supplied by the current source is designated as I, in the steady-state operation each of the tunnel diodes will conduct a current $I/n$ or $I/3$ in this case. Referring to FIGURE 1, $I/n$ is represented by $I_B$. The value of $I_B$ is determined by the type of tunnel diode used, the current source, the input signal available, and the output signal desired or required. Basically, the type of tunnel diode and the current source are reasonably variable parameters such that the value of $I_B$ is controlled more by the input signal available and the output signal desired. That is, the larger the desired output signal, the larger the value of $I_B$. On the other hand, however, the larger the value of $I_B$ the smaller the value of $I_{IN}$ required since $I_p$ is a fixed value. In effect then there are limitations on the maximum and minimum values of $I_B$. These limitations are imposed by $I_p$ and $I_V$ which define the tunnel diode operations. Clearly, $I_B$ must be greater than $I_V$ for reasonable operation. Moreover, since cascaded circuitry is contemplated for the instant device, the output signal must be sufficiently large, after amplification by output transformer 32, to trigger or switch a succeeding circuit. However, the output signal produced by any tunnel diode or combination of tunnel diodes must not be large enough to spuriously switch the associated tunnel diodes in the same gate. Consequently, a typical value of $I_B$ is about 8–10 milliamperes. This will provide an output signal ($I_{out}=I_B-I_V$) on the order of 3–6 milliamperes and require an input signal ($I_{in}=I_p-I_V$) on the order of about 10–14 milliamperes depending upon tolerances, etc. Taking a mean figure of $I_B=9$ ma., with $I_p=20$ ma. and $I_V=5$ ma., it will be seen that the input signal necessary (ignoring overdrive, etc. for purposes of illustration) is $I_{in}=I_p-I_B=11$ ma. The output signal produced $I_{out}=I_B-I_V=4$ ma. Consequently, if two (or less) of the three associated tunnel diodes 22, 23 and 24 in an AND gate are switched by input signals, the maximum combined output signal is less than the input signal required to switch the other tunnel diode. Thus, $$2I_{out}=8 \text{ ma.} < I_{in}=11 \text{ ma.}$$

Therefore, little or no current will flow in the emitter circuit of the transistor. Generalizing, it will be seen that $(n-1)I_{out}<I_{in}$.

Moreover, the emitter of the transistor 31 is biased at about +50 millivolts with respect to ground by the tunnel diodes, and the base is biased at about −50 millivolts by source 38. In view of the forward potential drop in the emitter-base junction it will be seen that the transistor presents a high impedance and very little current flows in the emitter-collector circuit. Inasmuch as the transistor produces no output signal at this time, output device 33 receives no input signal. Moreover, even if transistor 31 produced more than a negligible collector current under these conditions, transformer 32 provides effective D.C. isolation from output device 33. Therefore, an absence of input signals to the circuit produces no output signal.

As an example, it is assumed that a signal is supplied to transformer 28 by an input, for example input A. The polarity of the input signal is dependent upon the transformer connections. In the embodiment shown, the signal should provide a negative going signal with respect to the ground at the cathode of the tunnel diode. This signal has a magnitude which would tend to drive tunnel diode 22 to the high voltage operating region. Consequently, tunnel diode 22 will appear to switch from operating point 14 to operating point 15 (see FIGURE 1). However, the load impedance across the tunnel diode 22 includes, in addition to transistor 31, the tunnel diodes 23 and 24 in parallel. The forward impedance of the tunnel diodes 23 and 24 is on the order of a few ohms only. Additionally, the tunnel diodes provide a non-linear impedance across tunnel diode 22 such that the load line thereof is more nearly approximated by load line 16 of FIGURE 1. Consequently, with the removal of the input signal at the cathode of tunnel diode 22, the tunnel diode immediately reverts to the low level operating condition (operating point 14) since this is the only stable operating point of the circuit.

It will be seen that even though tunnel diode 22 conducts less current therethrough, tunnel diodes 23 and 24 have been so biased ($I_B$ is approximately 9 milliamperes) that the extra current (which may be considered an output or as additional current now available from the constant current source and on the order of 4 milliamperes) may be passed therethrough without switching these tunnel diodes beyond the peak point. Thus, each of the tunnel diodes 23 and 24 will effectively conduct about 2 milliamperes of the extra current, available due to the switching of tunnel diode 22. Each of the former tunnel diodes will, therefore, have the operating point 14 shifted to about 11 milliamperes which is clearly below the peak value ($I_p=20$ ma.).

Similarly, if input signals are supplied by any two of the inputs A, B, or C, similar to those previously described, the associated tunnel diodes 22, 23 and/or 24 will effectively switch to the high voltage operating state. However, as was the case in the instance of only one input signal, the unswitched tunnel diode represents a non-linear load on the switched diodes in addition to the load imposed by transistor 31. Thus, the load line for the switched tunnel diodes approximates the load line 16. Therefore, the switched tunnel diodes do not exhibit bistable operation inasmuch as only the stable operating point 14 applies thereto. Because of the difference in the loads applied to the switched tunnel diodes in the initial example and in this example, the load line may actually be one of a family of load lines similar to load line 16 and need not actually be coincident with load line 16. As in the initial example recited supra, more current will be available to the unswitched tunnel diode subsequent to the switching of the other two tunnel diodes. Thus, if it is assumed that tunnel diodes 22 and 23 are the switched diodes and tunnel diode 24 is the unswitched diode, an additional current on the order of 10 milliamps will be supplied to the tunnel diode 24. However, since the tunnel diode is biased such that the input signal applied thereto must have a minimum value of about 11 milliamperes, tunnel diode 24 is not spuriously switched by the additional current. Furthermore, since tunnel diodes 22 and 23 exhibit monostable operation, these tunnel diodes will revert to operating point 14 when the input signals supplied by sources 34 and 35 are removed. Thereafter, the tunnel diodes 22, 23 and 24 will operate in the low voltage region and each pass a current I/3 therethrough.

Therefore, it will be seen that with the application of only one or two input signals to the circuit by the input sources associated therewith (or any number of signals less than the total number of inputs), the tunnel diodes will exhibit monostable operation. This monostable operation is produced due to the non-linear loading thereof by the unswitched tunnel diodes associated with the circuit. Since the tunnel diodes exhibit monostable operation and are so biased to pass spurious additional current therethrough, the transistor portion of the circuit is not affected whereby an output is not produced at output device 33.

If now, sources 34, 35 and 36 each supply an input signal of the type described supra, i.e., a pulse having a negative potential with respect to ground, a negative going pulse will be applied to the cathodes of each of the tunnel diodes 22, 23 and 24. Each of these input signals is capable of effectively switching the tunnel diode to which it is applied to the high voltage operating region. In the case of three input signals applied to the circuit, it will be seen that each of the tunnel diodes 22, 23 and 24 will be switched to the high voltage operating condition. Consequently, there will be no unswitched tunnel diodes acting as a non-linear load on the circuit. Therefore, the load line, which controls is the linear load line 13 (see FIGURE 1). Thus it will be seen that the tunnel diodes 22, 23 and 24 exhibit a bistable type of operation. Consequently, when the input signals are removed the tunnel diodes will reside at operating point 15 (see FIGURE 1).

Because the tunnel diodes exhibit the bistable operation and reside at operating point 15, even with the removal of the input signals, the potential at the emitter of transistor 31 will inherently rise to approximately +500 millivolts with respect to ground. This rise is from the previous potential level of approximately +50 millivolts with respect to ground. The increase in the potential at the emitter of the transistor 31 creates an increase in the potential difference between the emitter and the base electrodes of the transistor. Consequently, the transistor 31 is turned further ON toward the saturated operating condition. Consequently, a large current flows from the emitter to the collector electrode of the transistor. This large current flow is controlled by the switching of the tunnel diodes. Consequently, the large current flow from the emitter to the collector of transistor 31 appears as a current pulse having a substantially short rise time. This short rise time pulse passes through the primary winding of the transformer 32 to the negative potential source 37. Inherently, the current pulse passing through the primary winding of transformer 32 creates a magnetic flux which links the secondary winding of transformer 32 and provides an output signal at output device 33. Since the signal produced by the secondary winding of transformer 32 will be in the nature of a spike or short lived pulse, the output device 33 may be a similar circuit to that previously described or it may be a flip flop which is set and reset in accordance with the signals produced by transformer 32. These output devices are merely illustrative or suggested devices and are not meant to be limitative of the invention.

Thus, it may be seen that the application of pulse or level input signals to the input circuits may be utilized to provide output signals which may be a pulse or level type of signal. Furthermore, it will be seen that the tunnel diode gating portion of the circuit contributes a pulse shaping operation insofar as the transistor 31 is concerned. That is, transistor 31 will receive a sharp, relatively high speed pulse with fast rise time regardless of the rise time of the signals supplied to the inputs.

In order to reset the circuit, it may be desirable to add a reset circuit comprising a conventional diode 39 having its anode connected to the anodes of the tunnel diodes 22, 23 and 24 and poled so that the tunnel diodes may be driven to the operating point 14 by the application of a negative going pulse with respect to ground. This pulse may be supplied by pulse source 40 which is connected to the cathode of diode 39. On the contrary, it may be desired that the signals supplied to the input sources may be of alternating polarity notation with a built in clock-type signal which automatically switches the tunnel diode associated therewith to the low voltage operating condition prior to the application of an informational input signal. The type of reset circuit is primarily functional and is suggested in alternative configurations since it is not a critical portion of the circuit but may be altered as is desired in accordance with the operation to which the circuit is to be put. Similarly, other modifications may be made in the circuit. Some of these have been previously suggested in that the type of tunnel diodes or other components may be altered without changing the basic concepts of the invention. Similarly, the transistor in the circuit need not have a grounded or common base configuration but may have some other connection depending upon the results desired from the transistor operation, i.e., amplification, high speed switching operation or the like.

The embodiments of the invention in which an exclusive property or privilege is claimed are defined as follows:

1. A logic circuit comprising, a plurality of tunnel diodes, a plurality of input means, one electrode of each of said tunnel diodes connected to a different one of said input means respectively, a transistor, another electrode of all of said tunnel diodes connected to a first electrode of said transistor, a potential source connected to a second electrode of said transistor, and output means connected to a third electrode of said transistor.

2. A logic circuit comprising a plurality of tunnel diodes, a plurality of input means, one electrode of each of said tunnel diodes connected to a different one of said input means respectively, a transistor, another electrode of all of said tunnel diodes connected to one electrode of said transistor, bias means connected to said tunnel diodes and said transistor to control the inintial operating conditions thereof, and output means connected to another electrode of said transistor.

3. A logic circuit comprising a plurality of tunnel diodes characterized by a plurality of operating conditions, bias means for biasing all of said tunnel diodes to one of said operating conditions, a transistor, bias means for biasing said transistor to one operating condition, a plurality of input means, a first electrode of each of said tunnel diodes connected to a different one of said input means respectively, a second electrode of all of said tunnel diodes connected to a first electrode of said transistor such that a change in the operating condition of all said tunnel diodes produces a change in the operating condition of said transistor, a potential source connected to a second electrode of said transistor, and output means connected to a third electrode of said transistor for sensing the operating condition of said transistor.

4. A logic circuit comprising a plurality of bistable, unilaterally conducting devices, a plurality of input means, one electrode of each of said devices connected to a different one of said input means respectively, a semiconductor amplifier, another electrode of all of said devices connected to one electrode of said amplifier, bias means connected to a second electrode of said amplifier, and output means connected to a third electrode of said amplifier.

5. A logic circuit comprising a plurality of tunnel diodes characterized by a plurality of operating conditions, bias means for biasing all of said tunnel diodes to the low voltage operating condition, a PNP transistor, bias means for biasing said transistor to the low current conducting condition, a plurality of input means, a first electrode of each of said tunnel diodes transformer coupled to a different one of said input means respectively, said input means adapted to provide signals for selectively shifting said tunnel diodes toward a high voltage operating condition, a second electrode of all of said tunnel diodes connected to an emitter electrode of said transistor, said transistor and said tunnel diodes being biased such that a change in the operating condition of all said tunnel diodes produces a change in the operating condition of said transistor, and output means connected to a collector electrode of said transistor for sensing the operating condition of said transistor.

6. In combination, a plurality of tunnel diodes, bias means connected to each of said tunnel diodes to control the steady state operating condition thereof, a plurality of input means separately connected to one electrode of each of said tunnel diodes, another electrode of all of said tunnel diodes connected together such that said tunnel diodes provide mutual loading effects to each other, said loading effect being effective to maintain said tunnel diodes in the low voltage operating condition in the absence of the application of a switching signal to each of said tunnel diodes by the associated input means, a transistor, bias means connected to said transistor to control the steady state operating condition thereof wherepy a high curent signal is produced only in response to the switching of all of said tunnel diodes and output means connected to said transistor.

7. A logic circuit comprising an AND gate and an amplifier, said AND gate including a plurality of tunnel diodes, a separate input means connected to each of said tunnel diodes respectively, a transistor connected to each of said tunnel diodes, a potential source connected to said transistor and said tunnel diodes for biasing purposes, and output means connected to said transistor.

8. In combination, a plurality of tunnel diodes, bias means connected to each of said tunnel diodes to normally maintain said tunnel diodes in the low voltage operating condition thereof, a plurality of input means separately connected to one electrode of each of said tunnel diodes, said input means adapted to provide input signals which tend to switch the operating condition of said tunnel diode to the high voltage operating condition, another electrode of all of said tunnel diodes conected together such that said tunnel diodes provide mutual loading effects to each other, said loading effect being effective to maintain said tunnel diodes in the low voltage operating condition in the absence of the simultaneous application of an input signal to each of said tunnel diodes by the associated input means, a transistor, bias means connected to said transistor to normally maintain said transistor in the relatively non-conducting condition thereof, said transistor connected to said tunnel diodes whereby a high current signal is produced in response to the switching of all of said tunnel diodes to the high voltage operating condition, and output means connected to said transistor.

References Cited by the Examiner

UNITED STATES PATENTS

| | | | |
|---|---|---|---|
| 3,021,517 | 2/62 | Kaenel | 307—88.5 |
| 3,094,631 | 6/63 | Davis | 307—88.5 |
| 3,122,657 | 2/64 | Thompson et al. | 307—88.5 |

OTHER REFERENCES

GE Tunnel Diode Manual, March 20, 1961, page 9, TK7872, S4G4.

RCA Techincal Notes, No. 512, March 1962, by Ditkofsky.

IBM Technical Disclosure Bulletin, April 1959, by Logue et al., vol. 1, No. 6, page 23.

Philco Application Lab Report 681, by Spiegel, December 1960, page 5.

ARTHUR GAUSS, *Primary Examiner.*